(12) United States Patent
Kanamori

(10) Patent No.: US 10,134,618 B2
(45) Date of Patent: Nov. 20, 2018

(54) SUBSTRATES STORING CONTAINER

(71) Applicants: MIRAIAL CO., LTD., Tokyo (JP); SHIN-ETSU POLYMER CO., LTD., Tokyo (JP)

(72) Inventor: Yuta Kanamori, Tokyo (JP)

(73) Assignees: MIRAIAL CO., LTD., Tokyo (JP); SHIN-ETSU POLYMER CO., LTD., Tokyo (JP)

( * ) Notice: Subject to any disclaimer, the term of this patent is extended or adjusted under 35 U.S.C. 154(b) by 328 days.

(21) Appl. No.: 14/895,890

(22) PCT Filed: Jun. 3, 2013

(86) PCT No.: PCT/JP2013/065415
§ 371 (c)(1),
(2) Date: Dec. 3, 2015

(87) PCT Pub. No.: WO2014/196011
PCT Pub. Date: Dec. 11, 2014

(65) Prior Publication Data
US 2016/0126122 A1    May 5, 2016

(51) Int. Cl.
*H01L 21/673* (2006.01)

(52) U.S. Cl.
CPC .. *H01L 21/67383* (2013.01); *H01L 21/67369* (2013.01); *H01L 21/67379* (2013.01)

(58) Field of Classification Search
CPC ......... H01L 21/67383; H01L 21/67379; H01L 21/67373; H01L 21/6732; H01L 21/67369; H01L 21/67376
See application file for complete search history.

(56) References Cited

U.S. PATENT DOCUMENTS

| | | | |
|---|---|---|---|
| 6,098,809 A | 8/2000 | Okada et al. | |
| 6,273,261 B1 * | 8/2001 | Hosoi | H01L 21/67294 206/459.5 |
| 7,325,698 B2 * | 2/2008 | Halbmaier | H01L 21/67373 206/710 |
| 7,337,911 B2 * | 3/2008 | Wu | H01L 21/67386 211/26 |
| 2003/0029765 A1 * | 2/2003 | Bhatt | B29C 45/14 206/454 |

(Continued)

FOREIGN PATENT DOCUMENTS

| JP | 2000-21966 | 1/2000 |
|---|---|---|
| JP | 2008-034879 | 2/2008 |

(Continued)

*Primary Examiner* — Robert Poon
(74) *Attorney, Agent, or Firm* — Muncy, Geissler, Olds & Lowe, P.C.

(57) ABSTRACT

The bottom plate has a plate-like shape, is arranged to face an outer face of a lower wall, and has a locking portion. The groove member has: a groove-forming portion having a groove opening downward formed therein, a surrounding wall portion, which is connected to the groove-forming portion, and is arranged around the groove-forming portion; and a locked portion, which is connected to the surrounding wall portion, is elastically deformable, and is locked by way of the locking portion of the bottom plate by being elastically deformed. The groove member is supported and fixed by way of the lower wall and the bottom plate.

7 Claims, 11 Drawing Sheets

(56) References Cited

U.S. PATENT DOCUMENTS

| | | | | |
|---|---|---|---|---|
| 2005/0199529 A1* | 9/2005 | Matsutori | ......... | H01L 21/67373 |
| | | | | 206/710 |
| 2005/0252827 A1* | 11/2005 | Tieben | .............. | H01L 21/67379 |
| | | | | 206/710 |
| 2007/0215516 A1* | 9/2007 | Sumi | ................. | H01L 21/67379 |
| | | | | 206/711 |
| 2015/0041353 A1* | 2/2015 | Adams | .............. | H01L 21/67369 |
| | | | | 206/454 |
| 2016/0141194 A1* | 5/2016 | Kirkland | .......... | H01L 21/67369 |
| | | | | 206/710 |

FOREIGN PATENT DOCUMENTS

| | | |
|---|---|---|
| JP | 2010-010598 | 1/2010 |
| JP | 2010-040612 | 2/2010 |
| WO | wo 2013/025629 A2 | 2/2013 |

\* cited by examiner

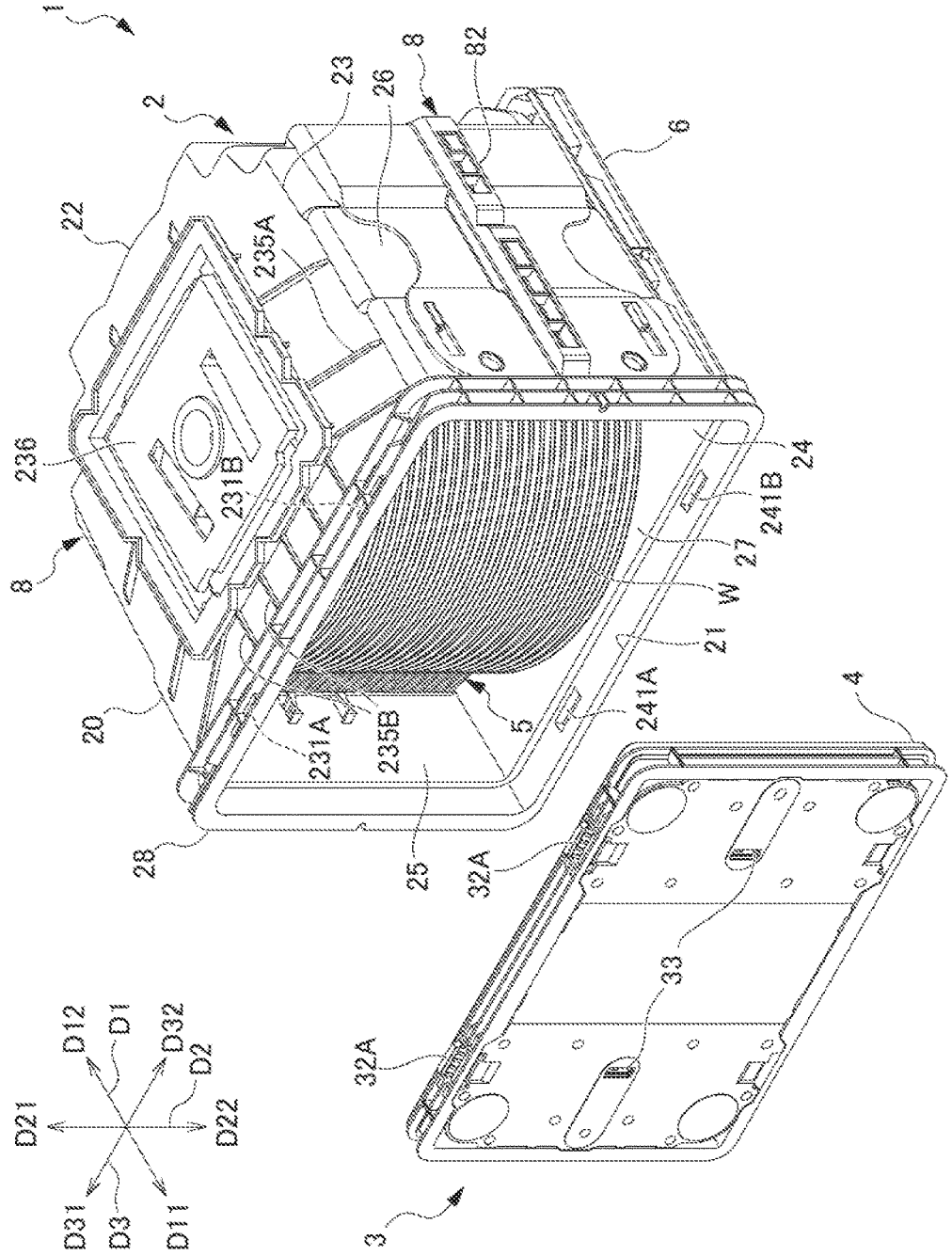

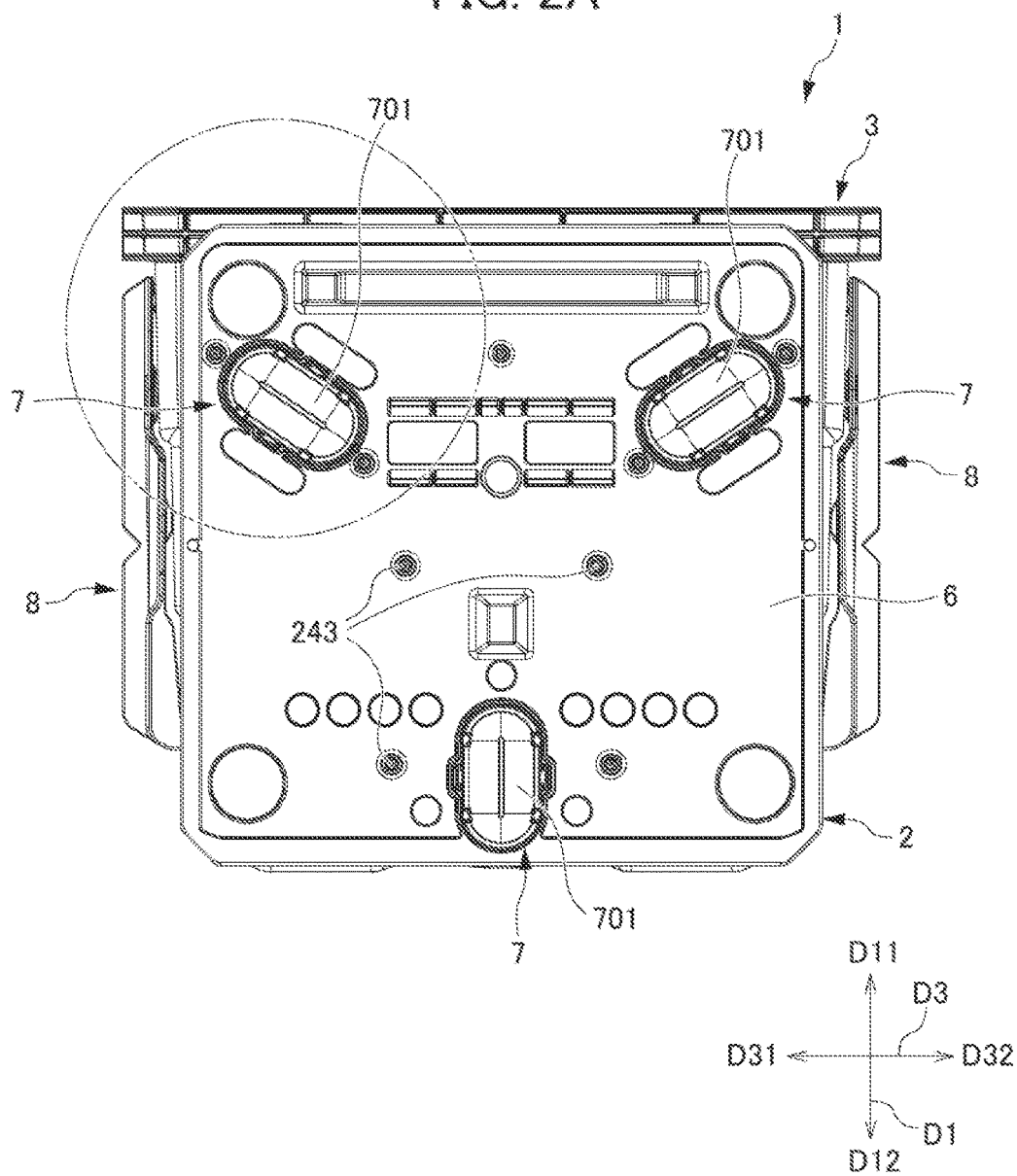

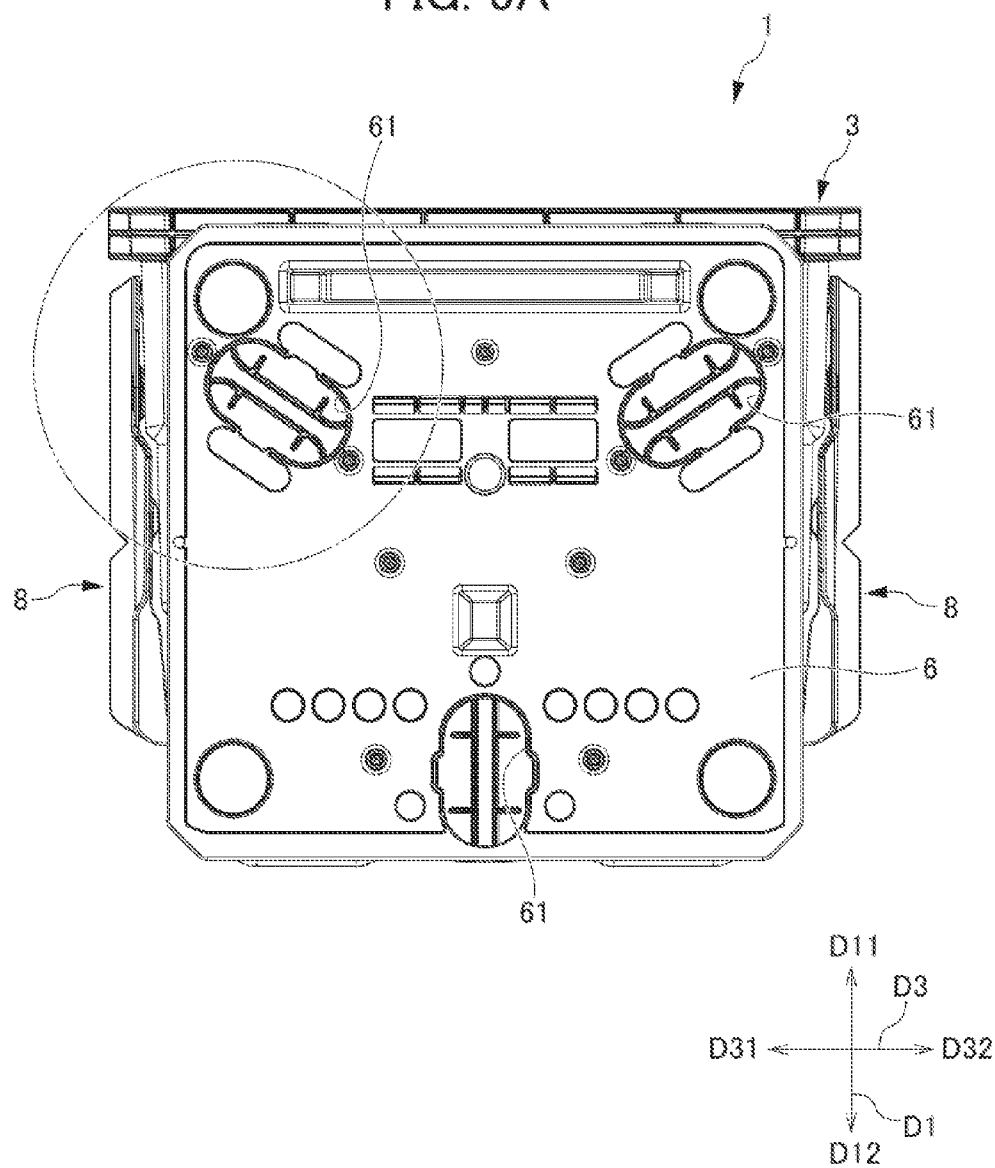

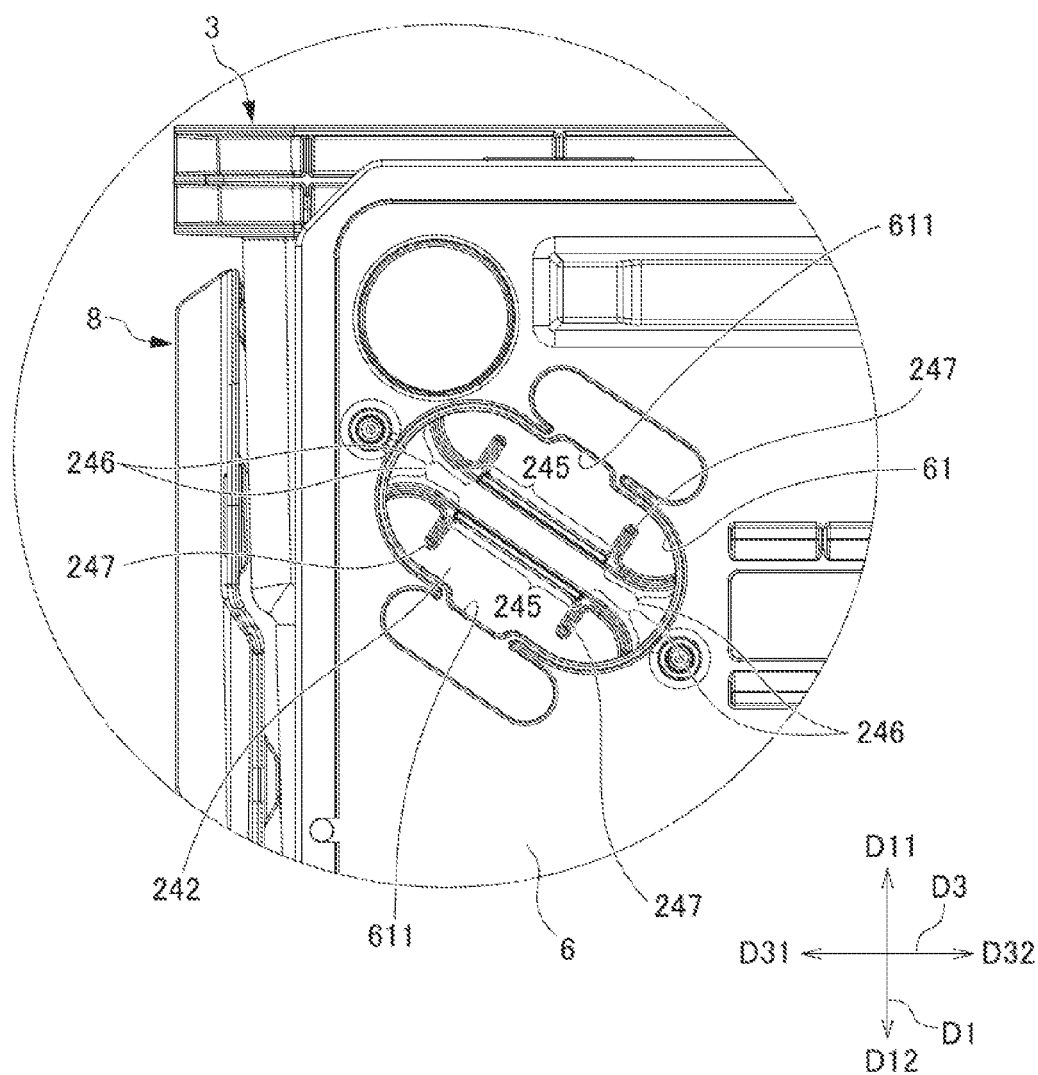

SUBSTRATES STORING CONTAINER

TECHNICAL FIELD

The present invention relates to a substrate storing container that stores substrates such as semiconductor wafers.

BACKGROUND ART

As a container that stores substrates such as semiconductor wafers, one has been known conventionally that has a configuration including a container main body, a lid body, and a groove member.

The container main body has a tubular wall portion in which a container main body opening portion is formed at one end, and in which the other end is closed. A substrate storing space is formed in the container main body. The substrate storing space is formed by being surrounded by the wall portion and can store a plurality of substrates. The lid body can be removably attached to the container main body opening portion and can close the container main body opening portion. Substrate support plate-like portions are provided at the wall portion so as to form a pair in the substrate storing space. When the container main body opening portion is not closed by the lid body, the substrate support plate-like portions can support edges of a plurality of substrates in a state in which adjacent substrates are arranged in parallel to be spaced by a predetermined interval.

A front retainer is provided at a portion which is a part of the lid body and faces the substrate storing space when the container main body opening portion is closed. When the container main body opening portion is closed by the lid body, the front retainer can support edges of a plurality of the substrates. Furthermore, a back side substrate support portion is provided at the wall portion so as to form a pair with the front retainer. The back side substrate support portion can support the edges of a plurality of the substrates. When the container main body opening portion is closed by the lid body, the back side substrate support portion retains the plurality of substrates in a state in which adjacent substrates are arranged in parallel to be spaced apart by a predetermined interval by supporting the plurality of substrates in cooperation with the front retainer.

The wall portions of the container main body includes a back wall, an upper wall, a lower wall, a first side wall, and a second side wall. A groove member is fixed at the lower wall. The groove member has a V-shape groove, and a support member that supports the substrate storing container is engaged with the groove. With the engagement of the groove with the support member, the substrate storing container is conveyed in a state of the substrate storing container being supported by the support member.

Patent Document 1: Japanese Unexamined Patent Application, Publication No. 2010-40612
Patent Document 2: Pamphlet of PCT International Publication No. WO2013/025629

DISCLOSURE OF THE INVENTION

Problems to be Solved by the Invention

The groove member includes a groove-forming portion and a hook member. The groove-forming portion forms a groove. The hook member is connected to the groove-forming portion and engaged with a bottom plate fixed to the lower wall or with the lower wall. Due to the hook member elastically deforming, the hook member is engaged with the bottom plate fixed to the lower wall and/or with the lower wall.

Recently, as substrates have increased in size, substrate storing containers also have increased in size, and thus there is a tendency for the weight of the substrate storing container that stores substrates to increase. For this reason, the load on the groove member has become greater, a result of which it is necessary to improve the strength of the groove member.

It is an object of the present invention to provide a substrate storing container having a groove member which can withstand the load of a substrate storing container of increased size with high durability.

Means for Solving the Problems

The present invention relates to a substrate storing container comprising: a container main body including a tubular wall portion with a container main body opening portion formed at one end portion and the other end portion closed, the wall portion having a back wall, an upper wall, a lower wall, and a pair of side walls, the container main body opening portion being formed by one end portion of the upper wall, one end portion of the lower wall, and one end portions of the side walls, in which a substrate storing space that can store a plurality of substrates and is in communication with the container main body opening portion is formed by an inner face of the upper wall, an inner face of the lower wall, inner faces of the side walls, and an inner face of the back wall; a lid body that is removably attached to the container main body opening portion and can close the container main body opening portion; a bottom plate having a plate-like shape, arranged to face an outer face of the lower wall, and including a locking portion; and a groove member including a groove-forming portion having a groove opening downward formed therein, a surrounding wall portion, which is connected to the groove-forming portion, and is arranged around the groove-forming portion, and a locked portion, which is connected to the surrounding wall portion, is elastically deformable, and is locked by means of the locking portion of the bottom plate by being elastically deformed, the groove member being supported and fixed by means of the lower wall and the bottom plate.

Furthermore, it is preferable that the groove-forming portion is connected to one end of the surrounding wall portion in the axial direction with respect to a circumferential direction of the surrounding wall portion, and the groove opens at an end of the surrounding wall portion in the axial direction of the surrounding wall portion, and the locked portion is connected to the other end of the surrounding wall portion in the axial direction of the surrounding wall portion.

Furthermore, it is preferable that the locked portion is configured by a cantilever spring that extends toward one end of the surrounding wall portion in the axial direction of the surrounding wall portion, along an outer face of the surrounding wall portion, from the other end of the surrounding wall portion in the axial direction of the surrounding wall portion.

Furthermore, it is preferable that an insertion through-hole to which the groove member can be inserted is formed in the bottom plate, and the locking portion of the bottom plate is configured by a portion of the bottom plate which is a rim portion around the insertion through-hole, and the cantilever spring includes a plate-like portion located at an extending end of the cantilever spring, and a locked convex portion that is located more toward a base end side of the cantilever spring than the plate-like portion and projects more in a distancing direction from the surrounding wall portion than the plate-like portion, and the locked convex portion is locked at the rim portion.

Furthermore, it is preferable that the groove member includes a rib portion which is connected to one portion of an inner face of the surrounding wall portion, the other portion of the inner face of the surrounding wall portion, and the groove-forming portion, an upper end face of the rib portion constituting an upper end face of the groove member, and a height adjustment convex portion projecting upward from an upper end face of the rib portion and abutting the lower wall is disposed at an upper end face of the rib portion.

Furthermore, it is preferable that a groove-bottom-forming portion which is a portion of the groove-forming portion and forms a bottom portion of the groove has a linear form, and a positioning convex portion projecting from both ends of the groove-bottom-forming portion is disposed at both ends of the groove-bottom-forming portion, and, at a lower face of the lower wall, two rails extending in parallel along a lower face of the lower wall are disposed at the lower face of the lower wall to project downward, and the positioning convex portion can be fit between the two rails.

Furthermore, it is preferable that the groove-forming portion is connected over an entirety of one end of the surrounding wall portion in an axial direction with respect to a circumferential direction of the surrounding wall portion, and the groove opens at one end of the surrounding wall portion in the axial direction of the surrounding wall portion, and a water-drain hole which is in communication with an inner space of the surrounding wall portion and an outer space of the surrounding wall portion is formed at a connection portion of the groove-forming portion and the surrounding wall portion at one end of the surrounding wall portion.

Effects of the Invention

In accordance with the present invention, it is possible to provide a substrate storing container which can withstand a load of a substrate storing container of increased size and has a groove member with high durability.

BRIEF DESCRIPTION OF THE DRAWINGS

FIG. 1 is an exploded perspective view illustrating a substrate storing container 1 according to an embodiment of the present invention;

FIG. 2A is a bottom view illustrating the substrate storing container 1 according to the embodiment of the present invention;

FIG. 5A is a bottom view illustrating a state in which the groove member 7 is removed from a container main body 2 of the substrate storing container 1 according to an embodiment of the present invention;

FIG. 5B is an enlarged bottom view illustrating a state in which the groove member 7 is removed from the container main body 2 of the substrate storing container 1 according to an embodiment of the present invention;

PREFERRED MODE FOR CARRYING OUT THE INVENTION

Figure 2B:
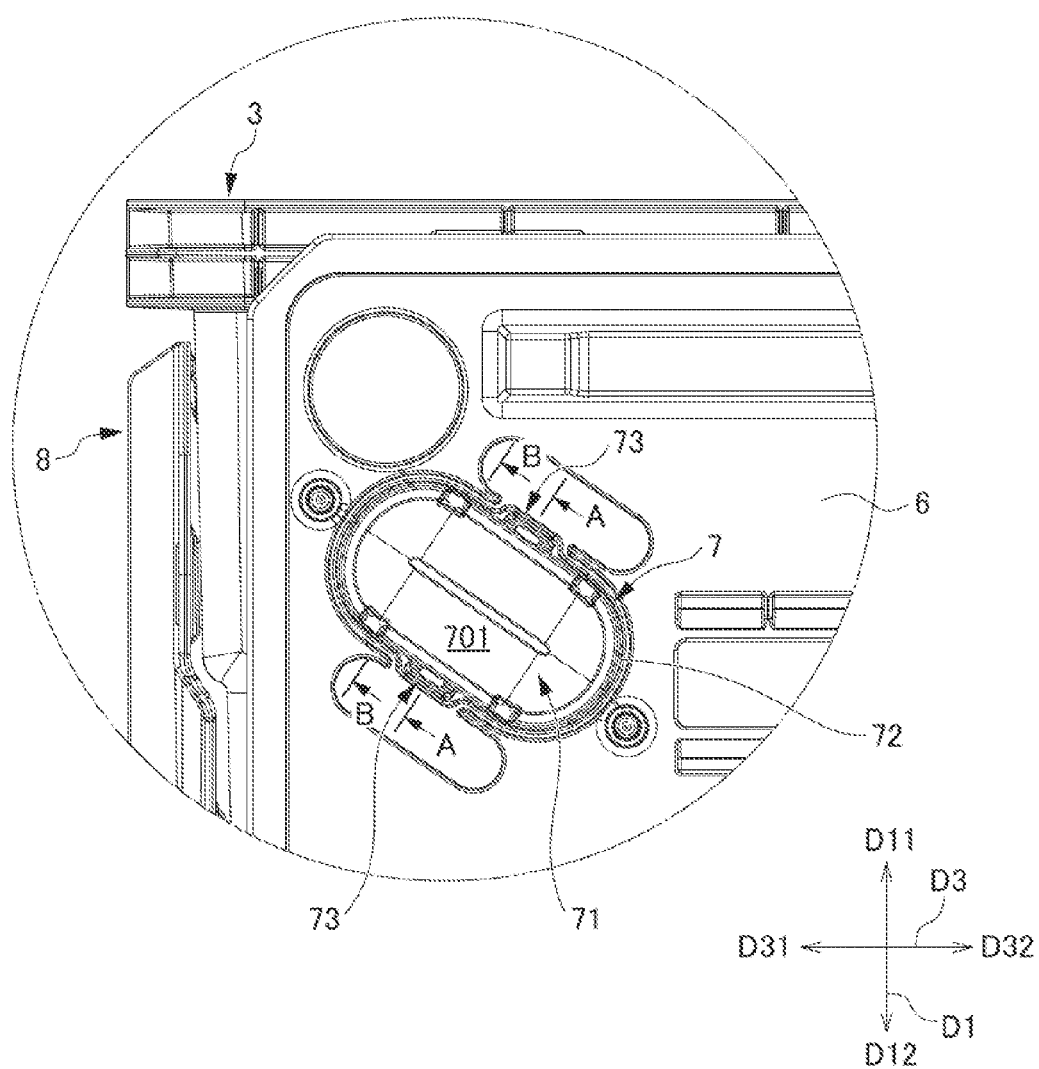
FIG. 2B is an enlarged bottom view illustrating the substrate storing container 1 according to an embodiment of the present invention.
Figure 3A:
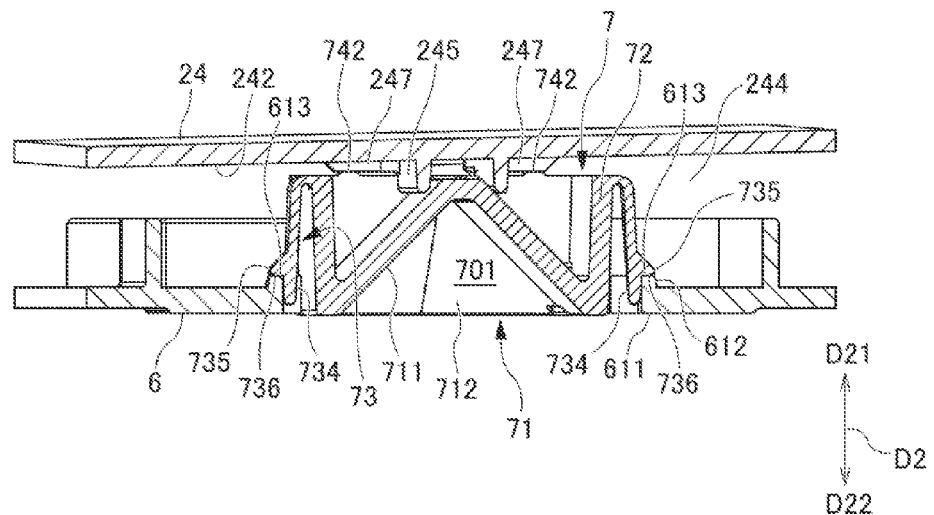
FIG. 3A is an enlarged sectional view of a main portion along the A-A line of FIG. 2B.
Figure 3B:
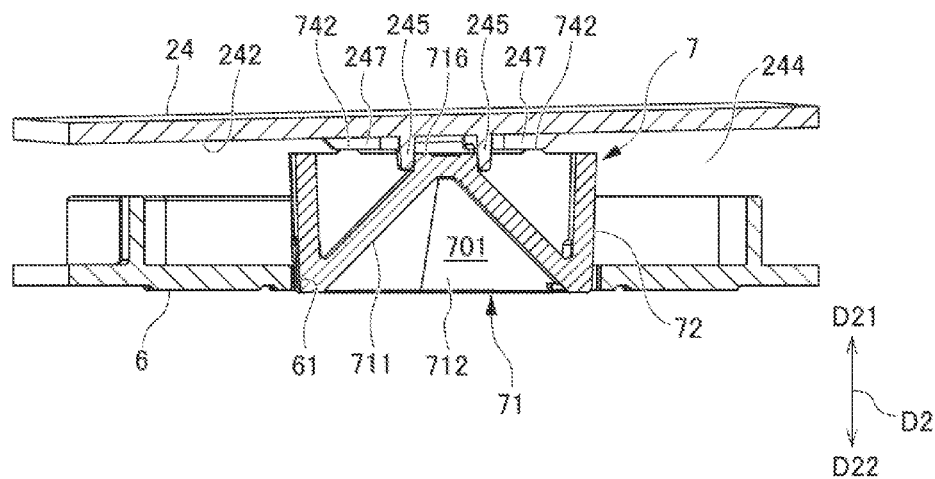
FIG. 3B is an enlarged sectional view of a main portion along the B-B line of FIG. 2B.

In the following, a substrate storing container 1 according to the first embodiment of the present invention is described with reference to the drawings. FIG. 1 is an exploded perspective view illustrating a substrate storing container 1 according to an embodiment of the present invention. FIG. 2A is a bottom view illustrating the substrate storing container 1 according to the embodiment of the present invention. FIG. 2B is an enlarged bottom view illustrating the substrate storing container 1 according to the embodiment of the present invention. FIG. 3A is an enlarged sectional view of a main portion along the A-A line in FIG. 2B. FIG. 3B is an enlarged sectional view of a main portion along the B-B line in FIG. 2B.

Figure 4A:
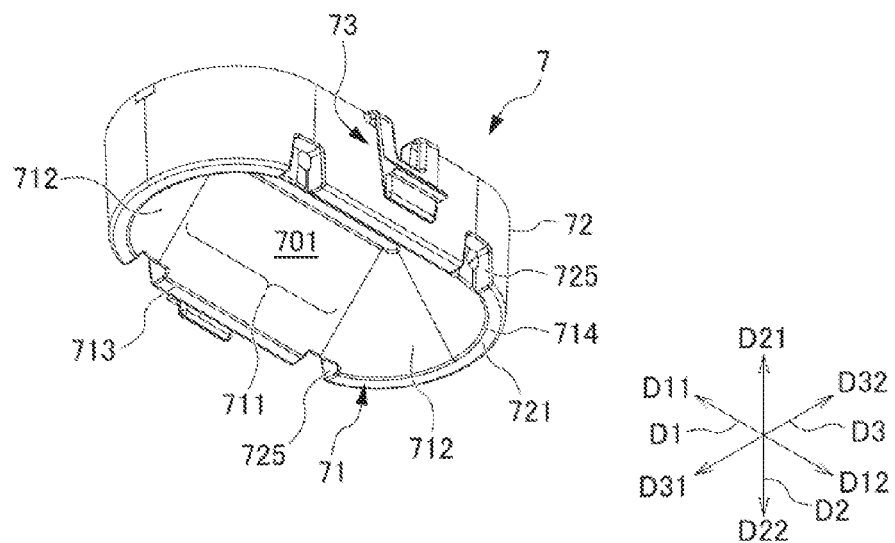
FIG. 4A is a perspective view from below illustrating a groove member 7 of the substrate storing container 1 according to an embodiment of the present invention.
Figure 4B:
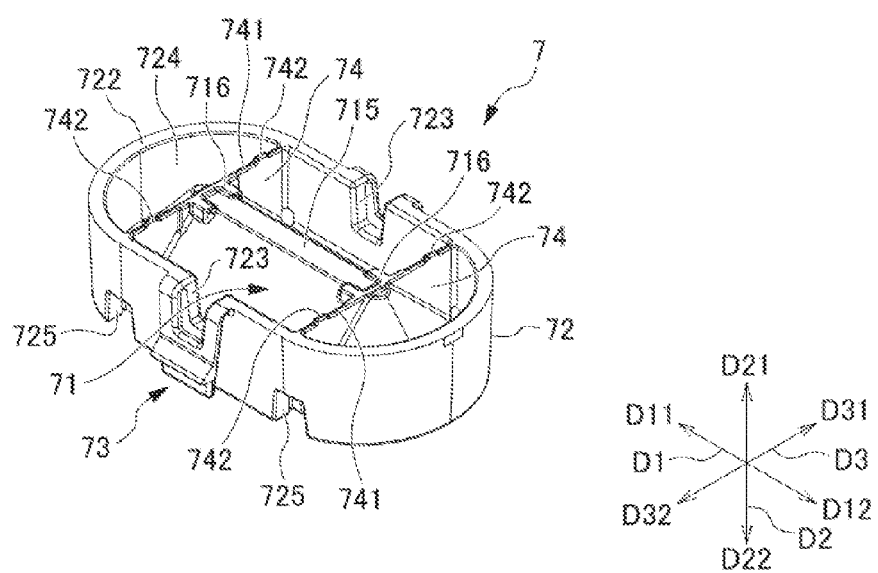
FIG. 4B is a perspective view from above illustrating the groove member 7 of the substrate storing container 1 according to an embodiment of the present invention.
Figure 4C:
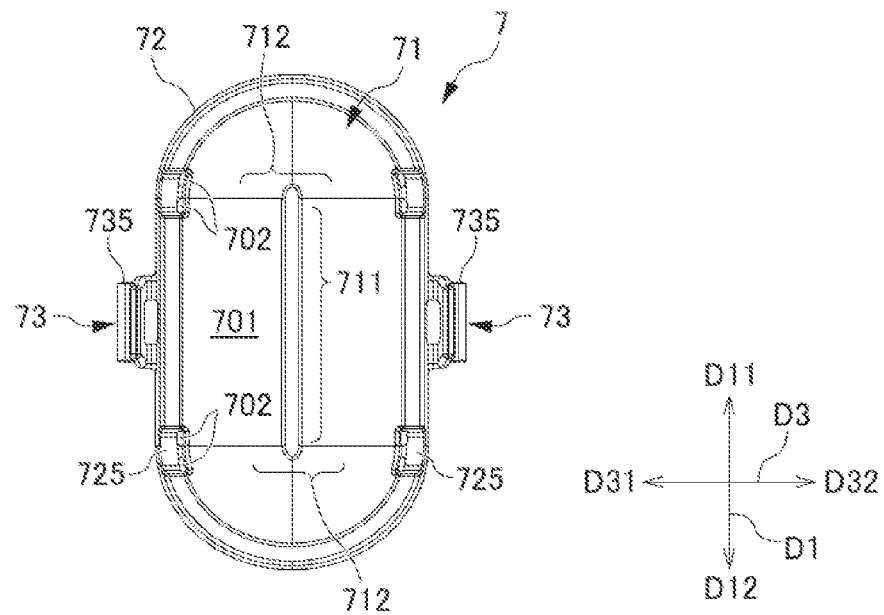
FIG. 4C is a bottom view illustrating the groove member 7 of the substrate storing container 1 according to an embodiment of the present invention.
Figure 4D:
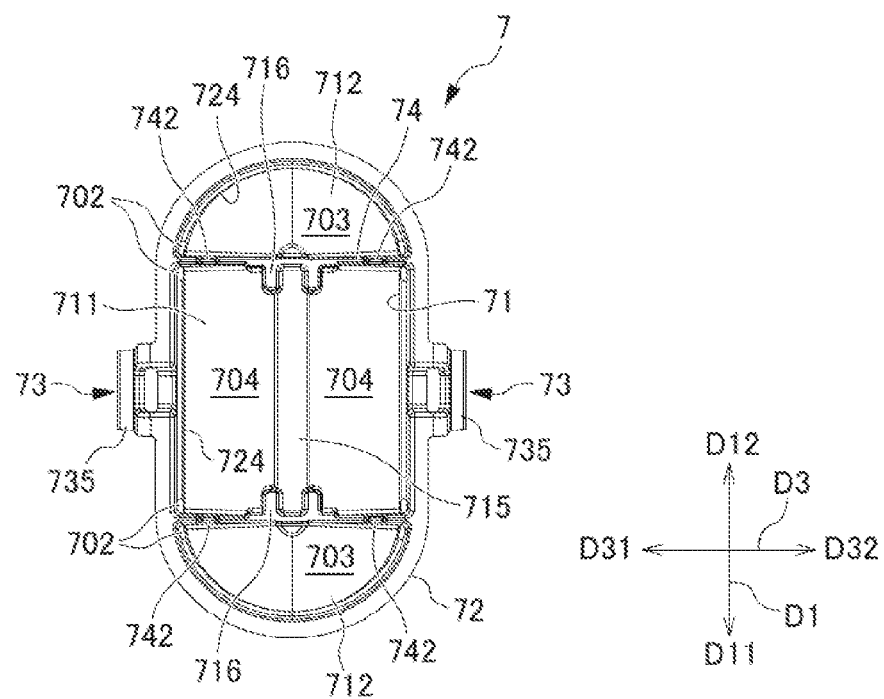
FIG. 4D is a plan view illustrating the groove member 7 of the substrate storing container 1 according to an embodiment of the present invention.
Figure 4E:
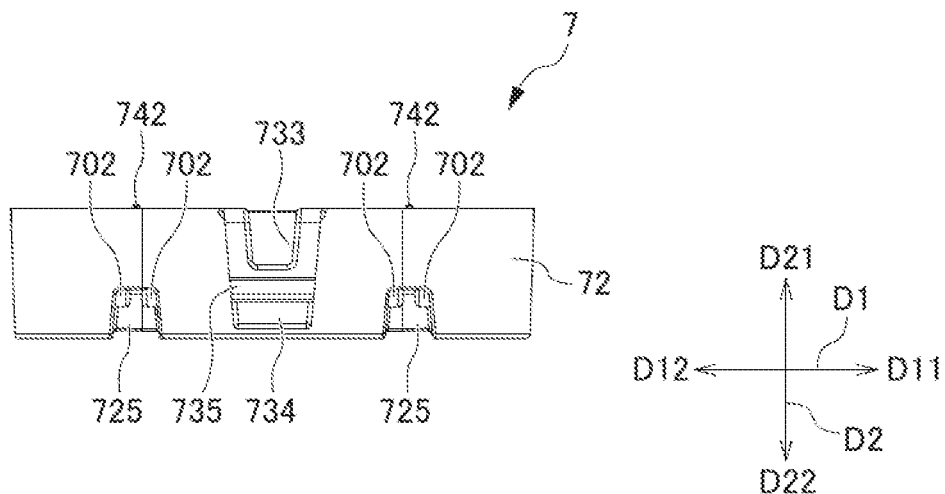
FIG. 4E is a side view illustrating the groove member 7 of the substrate storing container 1 according to an embodiment of the present invention.
Figure 4F:
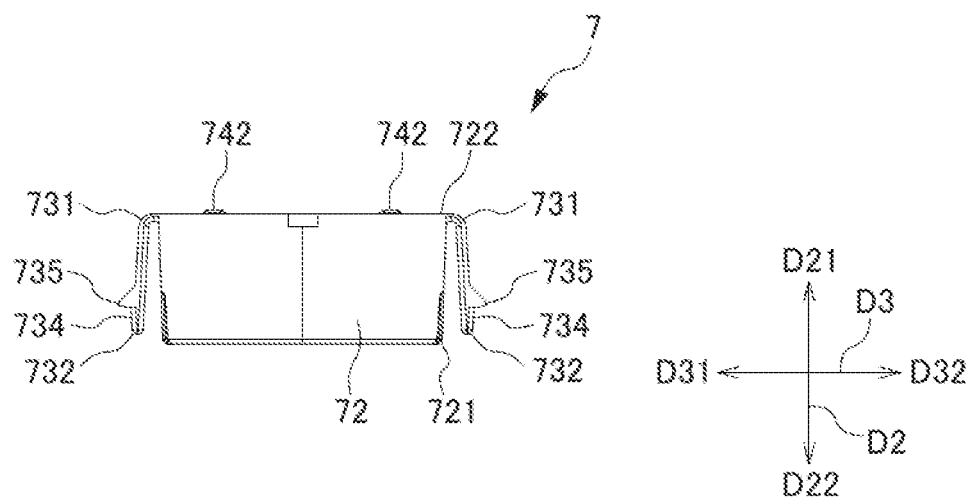
FIG. 4F is a front view illustrating the groove member 7 of the substrate storing container 1 according to an embodiment of the present invention.

FIG. 4A is a perspective view from below illustrating a groove member 7 of the substrate storing container 1 according to the embodiment of the present invention. FIG. 4B is a perspective view from above illustrating the groove member 7 of the substrate storing container 1 according to the embodiment of the present invention. FIG. 4C is a bottom view illustrating the groove member 7 of the substrate storing container 1 according to the embodiment of the present invention. FIG. 4D is a plan view illustrating the groove member 7 of the substrate storing container 1 according to the embodiment of the present invention. FIG. 4E is a side view illustrating the groove member 7 of the substrate storing container 1 according to the embodiment of the present invention. FIG. 4F is a front view illustrating the groove member 7 of the substrate storing container 1 according to the embodiment of the present invention.

Figure 6A:
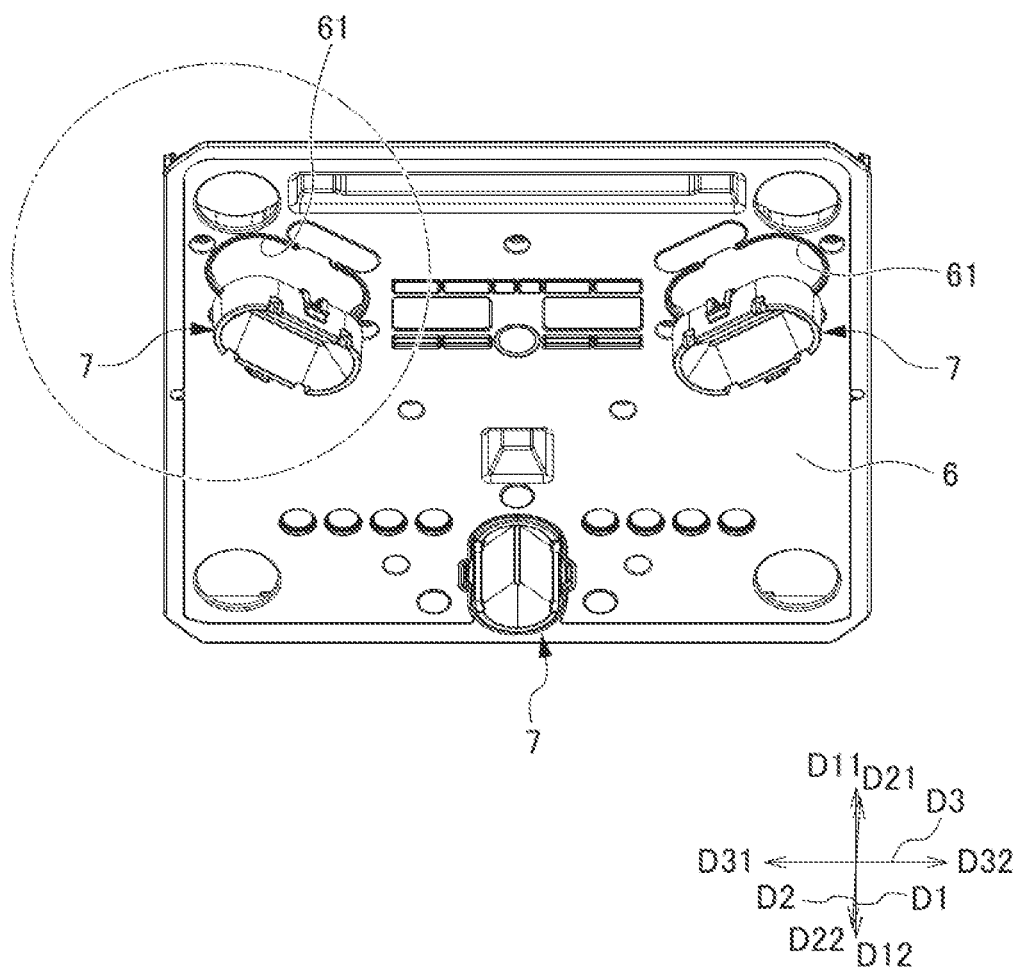
FIG. 6A is a perspective view illustrating a state in which the groove member 7 is attached to a bottom plate 6 of the substrate storing container 1 according to an embodiment of the present invention.
Figure 6B:
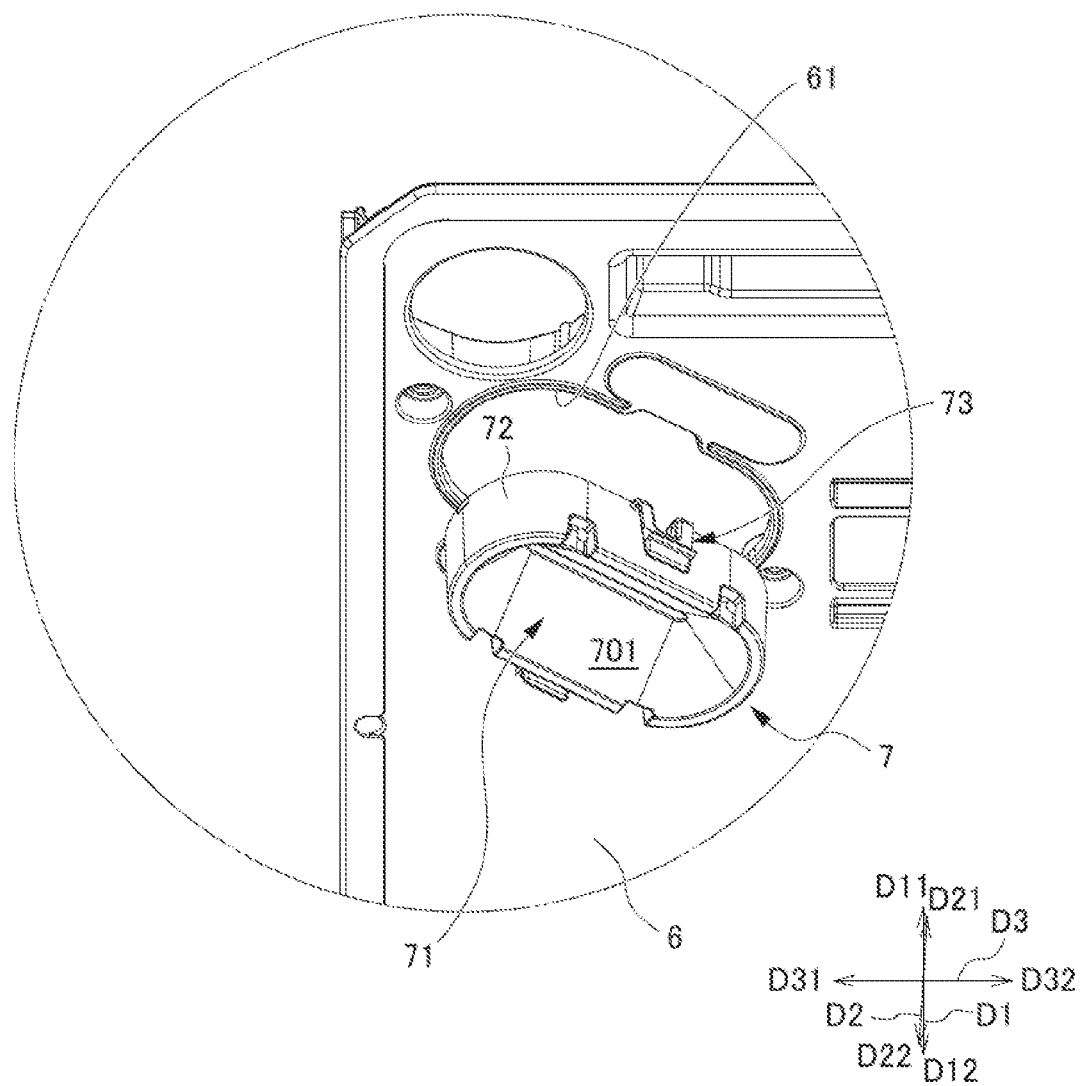
FIG. 6B is an enlarged perspective view illustrating a state in which the groove member 7 is attached to the bottom plate 6 of the substrate storing container 1 according to an embodiment of the present invention.

FIG. 5A is a bottom view illustrating a state in which the groove member 7 is removed from the container main body 2 of the substrate storing container 1 according to the embodiment of the present invention. FIG. 5B is an enlarged bottom view illustrating a state in which the groove member 7 is removed from the container main body 2 of the substrate storing container 1 according to the embodiment of the present invention. FIG. 6A is a perspective view illustrating a state in which the groove member 7 is attached to a bottom plate 6 of the substrate storing container 1 according to the embodiment of the present invention. FIG. 6B is an enlarged perspective view illustrating a state in which the groove member 7 is attached to the bottom plate 6 of the substrate storing container 1 according to an embodiment of the present invention.

Herein, for the purpose of illustration, the direction from a container main body 2 toward a lid body 3 (described later) (lower left direction in FIG. 1) is defined as a forward direction D11 and the direction opposite to the direction D11 is defined as a backward direction D12. Furthermore, these directions are defined as a forward/backward direction D1. In addition, the direction from a lower wall 24 to an upper wall 23 (described later) (upper direction in FIG. 1) is defined as an upper direction D21 and the direction opposite to the direction D21 is defined as a lower direction D22. Furthermore, these directions are defined as an upper/lower direction D2. Moreover, the direction from a second side wall 26 to a first side wall 25 (described later) (upper left direction in FIG. 1) is defined as a left direction D31 and the direction opposite to the direction D31 is defined as a right direction D32. Furthermore, these directions are defined as a left/right direction D3.

Furthermore, a substrate W (refer to FIG. 1) stored in a substrate storing container 1 is a disk-like silicon wafer, glass wafer, sapphire wafer, etc., and is a thin member used for industrial use. The substrate W in the present embodiment is a silicon wafer having a diameter of 450 mm.

As illustrated in FIG. 1, the substrate storing container 1 includes the container main body 2, a lid body 3, and the groove member 7 (refer to FIG. 2A, etc.).

The container main body 2 has a tubular wall portion 20 with a container main body opening portion 21 formed at one end portion and the other end portion closed. A substrate storing space 27 is formed in the container main body 2. The substrate storing space 27 is formed to be surrounded by the wall portion 20. The substrate support plate-like portion 5 is disposed at a part that is a portion of the wall portion 20 and forming the substrate storing space 27. A plurality of substrates W can be stored in the substrate storing space 27.

The substrate support plate-like portion 5 is provided at the wall portion 20 so as to form a pair in the substrate storing space 27 in the left/right direction D3. When the container main body opening portion 21 is not closed by the lid body 3, the substrate support plate-like portion 5 can support the edges of the plurality of substrates W in a state in which adjacent substrates W are arranged in parallel to be spaced apart by a predetermined interval. A back side substrate support portion (not illustrated) is provided at a back side of the substrate support plate-like portion 5. When the container main body opening portion 21 is closed by the lid body 3, the back side substrate support portion (not illustrated) can support rear portions of the edges of the plurality of substrates W.

The lid body 3 is removably attached to the container main body opening portion 21 and can close the container main body opening portion 21. A front retainer (not illustrated) is provided at a portion which is a part of the lid body 3 and faces the substrate storing space 27 (a back side face of the lid body 3 illustrated in FIG. 1) when the container main body opening portion 21 is closed. The front retainer (not illustrated) is provided so as to form a pair with the back side substrate support portion (not illustrated).

When the container main body opening portion 21 is closed by the lid body 3, the front retainer (not illustrated) can support front portions of the edges of the plurality of substrates W. When the container main body opening portion 21 is closed by the lid body 3, the front retainer (not illustrated) retains the plurality of substrates W in a state in which adjacent substrates W are arranged in parallel to be spaced apart at a predetermined interval by supporting the plurality of substrates W in cooperation with the back side substrate support portion (not illustrated).

As illustrated in FIG. 2A, the groove member 7 has a V-shaped groove 701 which opens downward, and three of the groove members 7 are arranged at a lower portion of the container main body 2. The V-shaped groove 701 can be engaged with a support member (not illustrated) that supports the substrate storing container 1.

As illustrated in FIG. 1, at a pair of side walls 25, 26 (described later) constituting the wall portion 20, a pair of handling members 8 is arranged to face an outer face of the pair of the side walls, respectively, so as to follow an outer face of the pair of the side walls 25, 26. By a lower portion of a rib 82 of the handling member 8 being supported by a fork lift (not illustrated), it is possible to lift the substrate storing container 1 by the fork lift. Each portion is described in detail in the following.

As illustrated in FIG. 1, the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are made of a plastic material, etc., and are configured so as to be integrally molded with polycarbonate in the first embodiment.

The first side wall 25 faces the second side wall 26 and the upper wall 23 faces the lower wall 24. A rear edge of the upper wall 23, a rear edge of the lower wall 24, a rear edge of the first side wall 25, and a rear edge of the second side wall 26 are all connected to the back wall 22. A front edge of the upper wall 23, a front edge of the lower wall 24, a front edge of the first side wall 25, and a front edge of the second side wall 26 have a positional relationship opposite the back wall 22, and configure an opening circumferential portion 28 which forms the container main body opening 21 in a substantially rectangular shape.

The opening circumferential portion 28 is provided at one edge portion of the container main body 2, and the back wall 22 is located at the other edge portion of the container main body 2. The profile of the container main body 2 formed by the outer faces of the wall portion 20 is a box shape. Inner faces of the wall portion 20, i.e. an inner face of the back wall 22, an inner face of the upper wall 23, an inner face of the lower wall 24, an inner face of the first side wall 25, and an inner face of the second side wall 26, form the substrate storing space 27, which is surrounded thereby. The container main body opening portion 21 formed by the opening circumferential portion 28 is surrounded by the wall portion 20 and is in communication with the substrate storing space 27 formed inside the container main body 2. The substrate storing space 27 can store a maximum of twenty-five substrates W in a positional relationship of an upper face and a lower face of the substrate W being substantially horizontal.

As illustrated in FIG. 1, latch engagement concave portions 231A, 231B, 241A, and 241B, which are concave outwardly from the substrate storing space 27, are formed at portions of the upper wall 23 and the lower wall 24 which are proximal to the opening circumferential portion 28. Each of the latch engagement concave portions 231A, 231B, 241A, and 241B is respectively formed in the vicinities of both right and left edge portions of the upper wall 23 and the lower wall 24. The total amount thereof is four.

As illustrated in FIG. 1, a flange fixing portion (not illustrated) and ribs 235A, 235B are provided so as to be integrally formed with the upper wall 23 at an outer face of the upper wall 23. The flange fixing portion (not illustrated) is arranged at the center portion of the upper wall 23. As illustrated in FIG. 1, a top flange 236 is fixed at the flange fixing portion (not illustrated). The top flange 236 is arranged at the center portion of the upper wall 23. When suspending the substrate storing container 1 by AMHS (Automated Material Handling System), PGV (Person Guided Vehicle), etc., the top flange 236 is hung by an arm of these machines (not illustrated) serving as a suspending member, whereby the substrate storing container 1 is suspended by an arm.

The rib 235A and the rib 235B are provided at the upper wall. A plurality of the ribs 235A extends in a left forward direction and in a right forward direction, respectively, from the top flange 236. Furthermore, a plurality of the ribs 235B extends in the forward direction D11 from the top flange 236 and extends in the backward direction D12 from the top flange 236.

A bottom plate 6 is fixed at the lower wall 24. The bottom plate 6 has a plate-like shape in a substantially rectangular shape that faces substantially the entire face of the lower face 242 (refer to FIG. 3A, etc.) constituting the lower wall 24 and, as illustrated in FIG. 2A, is fixed to the lower wall 24 by way of screws 243. A space 244 (refer to FIG. 3A, etc.) is formed between the bottom plate 6 and the lower wall 24. It should be noted that the fixing of the bottom plate 6 to the lower wall 24 is not limited to the screw 243. Other than the fixing by way of the screw 243, in place of the screw 243, fixing may be performed by way of adhering, soldering, etc.

As illustrated in FIG. 6A, etc., insertion through-holes 61 are formed at the bottom plate 6. The insertion through-hole 61 has a substantially rectangular shape and the groove member 7 can be inserted into the insertion through-hole 61. It should be noted that, in FIGS. 6A and 6B, only the bottom plate 6 and the groove member 7 are illustrated for convenience. As illustrated in FIG. 2A, the insertion through-holes 61 are located at an interval of 120 degrees in a circumferential direction of the bottom plate 6 with the center of the bottom plate 6 as a center. The insertion through-holes 61 have a positional relationship of the longitudinal direction being radial with the center of the bottom plate 6 as a center.

As illustrated in FIG. 5B, locked portion insertion portions 611 are formed at both end portions in the width direction of the insertion through-hole 61 in the longitudinal direction of the insertion through-hole 61. Since the locked portion insertion portions 611 are formed, the width of the insertion through-holes 61 at the portions at which the locked portion insertion portions 611 are formed is formed to be wide. A locked portion 73 of the groove portion 7 (described later) can be inserted into the locked portion insertion portion 611. The portion which is a rim portion around the insertion through-hole 61 constituted by the portion of the bottom plate 6 and which forms the locked portion insertion portion 611 constitutes a locking portion, and has a locking portion convex portion 612 that projects in an upper direction (refer to FIG. 3A, etc.).

As illustrated in FIG. 5B, two rails 245 exist at a portion of the lower face 242 of the lower wall 24 that faces the insertion through-hole 61 of the bottom plate 6. The two rails 245 extend in parallel in the longitudinal direction of the insertion through-hole 61 along the lower face 242 of the lower wall 24, and project in the lower direction D22. As viewed from the bottom, further from the one end and the other end of the two rails 245, a pair of rail extension portions 246 exists along the lower face 242 of the lower wall 24 so as to extend the two rails 245, respectively. As viewed from the bottom, a pair of the rail extension portions 246 respectively curve and extends so as to be spaced apart from each other along the lower face 242 of the lower wall 24.

The projection amount of the rail extension portion 246 in the lower direction D22 is smaller than the projection amount of the two rails 245 in the same direction. Furthermore, perpendicular extending portions 247 exist which extend in a direction perpendicular to the extending direction of the two rails 245, respectively, at portions of a pair of the rail extension portions 246 connected to the two rails 245. The projection amount of the perpendicular extending portion 247 in the lower direction D22 is the same as the projection amount of the rail extension portion 246 in the same direction.

As illustrated in FIG. 4B, etc., the groove member 7 includes a groove-forming portion 71, a surrounding wall portion 72, a locked portion 73, and a pair of parallel wall portions 74 as rib portions, and is supported and fixed by the lower wall 24 and the bottom plate 6. Furthermore, the groove member 7 has a point-symmetric shape with the center position as viewed from the bottom illustrated in FIG. 4C as a center. It should be noted that, FIGS. 4A to 4F illustrate the groove member 7 which is located at the most rear side in the backward direction (D12) among the three groove members 7 illustrated in FIG. 2A.

As illustrated in FIGS. 4A, 4B, etc., the surrounding wall portion 72 has a substantially tubular shape, and the cross section perpendicular to the upper/lower direction D2 as the axial direction of the surrounding wall portion 72 has a slightly smaller oval shape than the insertion through-hole 61. The thickness in the radial direction of the surrounding wall portion 72 is approximately 4 mm and is configured to be thick. The surrounding wall portion 72 is arranged so as to circle and surround the circumference of the groove-forming portion 71. At the center portion in the longitudinal direction of the oval surrounding wall portion 72, a pair of rectangular cutouts 723 formed from an upper end to a lower end in the axial direction of the surrounding wall portion 72 is formed.

The groove-forming portion 71 includes a gable-like portion 711 and a pair of semi-conical portions 712. The pair of the semi-conical portions 712 has a shape made by cutting one cone in half from a face including the shaft center, for example. However, in practice, the pair of the semi-conical portions 712 is not formed by cutting one cone, but is formed integrally with the gable portion 711, the surrounding wall portion 72, the locked portion 73, and the parallel wall portion 74.

The gable portion 711 has a gable-roof shape. As mentioned above, an end face in the longitudinal direction of the gable portion 711 is an end face of the pair of the semi-conical portions 712 having a shape made by cutting one cone in half, for example, and is integrally molded to be connected to an end face corresponding to the section. Therefore, the gable portion 711 constitutes the center portion of the groove-forming portion 71.

A V-shaped groove 701 that opens downwards is formed at the lower face of the gable portion 711. An end of the V-shaped groove 701 is closed by the lower face of the semi-conical portion 712 in the longitudinal direction of the gable portion 711. A lower end 713 of the gable portion 711 is integrally molded to be connected to a lower end 721 of the surrounding wall portion 72, and a lower end 714 of the semi-conical portion 712 is connected to a lower end of the surrounding wall portion 72 by being integrally formed. Therefore, the entire lower end 721 as one end of the surrounding wall portion 72 having a substantially tubular shape is connected to the gable portion 711 and the semi-conical portion 712 that constitute the groove-forming portion 71. The V-shaped groove 701 is opened at the lower end 721 serving as one end of the surrounding wall portion 72 in the axial direction (the upper/lower direction D2) of the surrounding wall portion 72. The thickness of the gable portion 711 and the semi-conical portion 712 is approximately 4 mm, similarly to the thickness of the surrounding wall portion 72, and is configured to be thick.

As illustrated in FIGS. 4B and 4D, a groove-bottom-forming portion 715 of the gable portion 711 that forms a bottom portion of the groove 701 has a linear form. At both ends in the longitudinal direction of the groove-bottom-forming portion 715, positioning convex portions 716 of substantially U-shape as viewed from a plan view are present, respectively. The positioning convex portions 716 are arranged so as to surround, in a substantially U-shape, the ends of the groove-bottom-formed portion 715 of the gable portion 711, and project upward more above than the upper end of the groove-bottom-formed portion 715. The positioning convex portion 716 at one end in the longitudinal direction of the groove-bottom-formed portion 715 and the positioning convex portion 716 at the other end in the longitudinal direction of the groove-bottom-forming portion 715 can be fit between the two rails 245, respectively. With such fitting, the groove member 7 is positioned in a direction perpendicular to the two rails 245.

As illustrated in FIGS. 4B and 4D, a pair of the parallel wall portions 74 as the rib portions is integrally molded to be connected to the gable portion 711 and the semi-conical portion 712 at a connection portion of the gable portion 711 and the semi-conical portion 712. A pair of the parallel wall portions 74 is located at an upper side of the gable portion 711 and the semi-conical portion 712, and has a parallel positional relationship in a direction perpendicular to the longitudinal direction of the gable portion 711. An upper end face 741 of a pair of the parallel wall portions 74, an upper end face of the positioning convex portion 716, and an upper end face of the surrounding wall portion 72 has a flush positional relationship. The upper end face 741 of a pair of the parallel wall portions 74 constitutes an upper end face of the groove member 7.

As illustrated in FIG. 4B, both ends of a pair of the parallel wall portions 74 in a direction perpendicular to the longitudinal direction of the gable portion 711 are integrally molded to be connected to a portion of an inner face 724 of the surrounding wall portion 72, and the other portions of the inner face 724 of the surrounding wall portion 72, which is different from the portion of the inner face 724, respectively. Lower ends of ends of a pair of the parallel wall portions 74 are integrally molded to be connected to upper faces of both ends in the longitudinal direction of the gable portion 711. At side faces of a pair of the parallel wall portions 74 that face each other, both ends in the longitudinal direction of the two rails 245 can abut. With this abutting, the groove member 7 is positioned in the longitudinal direction of the two rails 245.

A height adjustment convex portion 742 is present at a portion which is the upper end face 741 of a pair of the parallel wall portion 74, and is between the positioning convex portion 716 and an end of the parallel wall portion 74 connected to the surrounding wall portion 72. The height adjustment convex portion 742 is integrally molded to be connected to the upper end face 741 of the parallel wall portion 74. The height adjustment convex portion 742 projects from the upper end face 741 of the parallel wall portion 74 in the upper direction D21, and can abut a lower end face of the perpendicular extending portion 247 (refer to FIG. 5B) of the lower wall 24. With this abutting, the groove member 7 is fixed at the lower wall 24 and the bottom plate 6 in a state in which rattling will not occur.

As illustrated in FIGS. 4C and 4E, water-drain holes 702 are formed at connecting portions of the groove-forming portion 71 and the surrounding wall portion 72 at an end of the surrounding wall portion 72. A total of eight of the water-drain holes 702 are formed adjacent to the lower ends of the parallel wall portions 74 to make pairs so as to sandwich the lower end of the parallel wall portions 74. At portions of the surrounding wall portion 72 at which the water-drain holes 702 are formed, a water-drain cutout 725 of rectangular shape which is formed from the lower end 721 toward the upper end 722 of the surrounding wall portion 72 are formed, and the water-drain holes 702 forming pairs are in communication with the water-drain cutouts 725, respectively. Then, the water-drain hole 702 is in communication with an inner space of the surrounding wall portion 72 and an outer space of the surrounding wall portion 72.

As illustrated in FIG. 4D, more specifically, the water-drain hole 702 is in communication with a space 703 surrounded by the inner face 724 of the surrounding wall portion 72, an upper face of the semi-conical portion 712, and the parallel wall portion 74 or a space 704 surrounded by the inner face 724 of the surrounding wall portion 72, an upper face of the gable portion 711, and a pair of the parallel wall portion 74, and an outer space of the surrounding wall portion 72. When washing the substrate storing container 1, the water-drain holes 702 discharge into the outer space of the surrounding wall portion 72 a washing liquid stored in the space 703 surrounded by the inner face 724 of the surrounding wall portion 72, an upper face of the semi-conical portion 712, and the parallel wall portion 74 or the space 704 surrounded by the inner face 724 of the surrounding wall portion 72, an upper face of the gable portion 711, and a pair of the parallel wall portion 74.

The locked portion 73 is configured by an elastically deformable cantilever spring. As illustrated in FIG. 4F, etc., the base portion 731 of the locked portion 73 is integrally molded to be connected to an upper end 722 serving as the other end of the surrounding wall portion 72 in the axial direction of the surrounding wall portion 72 (the upper/lower direction D2). The locked portion 73 extends toward the lower end 721 serving as one end of the surrounding wall portion 72 in the axial direction of the surrounding wall portion 72 along an outer face of the surrounding wall portion 72 from the upper end 722 of the surrounding wall portion 72 in the axial direction of the surrounding wall portion 72. A free end 732 of the locked portion 73 is located slightly more above the lower end 721 of the surrounding wall portion 72 in the upper/lower direction D2.

As illustrated in FIG. 4E, at the locked portion 73 as viewed from a side, a spring cutout 733 having a positional relationship corresponding to the cutout 723 is formed. Since the spring cutout 733 is formed, an upper half portion of the locked portion 73 has a shape branching into two from the lower half portion. The lower half portion of the locked portion 73 has a plate-like portion 734 and a locked convex portion 735. The plate-like portion 734 is located at an extending end of the locked portion 73, and constitutes a portion of a free end of a cantilever spring.

The locked convex portion 735 exists at a position which is at a base portion side of the locked portion 73 constituted by the cantilever spring more than the plate-like portion 734, and which is more to a lower side than the upper half portion of the locked portion 73 that branches into two. The locked convex portion 735 projects more in a direction distancing from the surrounding wall portion 72 than the plate-like portion 734. As illustrated in FIG. 4F, the locked portion 735 as viewed from the front of the groove member 7 has a substantially isosceles right triangle shape which gets closer to the surrounding wall portion 72 as approaching the upper direction D21. As the groove member 7 is inserted into the insertion through-hole 61 (refer to FIG. 5A, etc.), the locked portion 73 becomes elastically deformed. Then, the lower end face 736 of the locked convex portion 735 abuts the upper end face 613 of the locking portion convex portion 612 (refer to FIG. 3A, etc.), and the locked portion 73 is locked to the locking portion.

As illustrated in FIG. 1, the lid body 3 has a substantially rectangular shape that substantially corresponds to the shape of the opening circumferential portion 28 of the container main body 2. The lid body 3 is removably attached with respect to the opening circumferential portion 28 of the container main body 2, and can close the container main body opening portion 21, by the lid body 3 being attached to the opening circumferential portion 28. A ring-like sealing member 4 is attached to a face that faces a face of a step portion (sealing face) formed at a position which is at an inner face of the lid body 3 (a back side face of the lid body 3 illustrated in FIG. 1), and is slightly in the backward direction D12 from the opening circumferential portion 28 when the lid body 3 closes the container main body opening portion 21. The sealing member 4 is made of elastically deformable POE (polyoxyethylene) or PEE, or alternatively made of various types of thermoplastic elastomer such as polyester and polyolefin, fluorine containing rubber, silicon rubber, etc. The sealing member 4 is arranged so as to go around the circumferential edge portion of the lid body 3.

When the lid body 3 is attached to the opening circumferential portion 28, the sealing member 4 is elastically deformed by being sandwiched between the face of the step portion (sealing face) mentioned above and the inner face of the lid body 3, and the lid body 3 is closed in a state of tightly sealing the container main body opening portion 21. By the lid body 3 being removed from the opening circumferential portion 28, it is possible to load or unload the substrates W relative to the substrate storing space 27 in the container main body 2.

A latching mechanism is provided at the lid body 3. The latching mechanism is provided in the vicinity of both left and right end portions of the lid body 3. As illustrated in FIG. 1, the latching mechanism includes two upper side latch portions 32A which can project from the upper side of the lid body 3 in the upper direction D21 and two lower side latch portions (not illustrated) that can project from the lower side of the lid body 3 in the lower direction D22. The two upper side latch portions 32A are arranged in the vicinity of both left and right ends of the upper side of the lid body 3 and the two lower side latch portions are arranged in the vicinity of both left and right ends of the lower side of the lid body 3.

An operation portion 33 is provided at an outer face of the lid body 3. By operating the operation portion 33 from the front side of the lid body 3, it is possible to cause the upper side latch portion 32A and the lower side latch portion (not illustrated) to project from the upper side and the lower side of the lid body 3 as well as possible to make enter a state not projecting from the upper side and the lower side of the lid body 3. By the upper side latch portion 32A projecting from the upper side of the lid body 3 in the upper direction D21 to engage with the latch engagement concave portions 231A and 231B of the container main body 2 and the lower side latch portion projecting from the lower side of the lid body 3 in the lower direction D22 to engage with the latch engagement concave portions 241A and 241B of the container main body 2, the lid body 3 is fixed to the opening circumferential portion 28 of the container main body 2.

A concave portion (not illustrated) which is concave outwardly from the substrate storing space 27 is formed inside the lid body 3. In the concave portion (not illustrated), a front retainer (not illustrated) is provided and fixed.

The front retainer includes a front retainer substrate receiving portion (not illustrated). The front retainer substrate receiving portion is arranged in two pieces to be spaced apart by a predetermined interval in the left/right direction D3 so as to form a pair. The front retainer substrate receiving portions arranged in two pieces so as to form a pair as above are provided such that twenty-five pieces thereof are arranged in parallel in the upper/lower direction D2. By the substrates W being stored in the substrate storing space 27 and the lid body 3 being closed, the front retainer substrate receiving portion sandwiches and supports end edges of the edge portions of the substrates W.

In the substrate storing container 1 with the abovementioned configuration, the attachment/removal of the groove member 7 with respect to the lower wall 24 and the bottom plate 6 is performed as follows.

As illustrated in FIGS. 6A and 6B, the groove member 7 is initially inserted into the insertion through-hole 61 in the positional relationship of the groove member 7 with the groove 701 opening downward. Then, a projecting end of the locked convex portion 735 (refer to FIG. 3A) abuts a portion at which the locked portion insertion portion 611 constituted by the bottom plate 6 is formed. With such a configuration, the locked portions 73 constituted by the cantilever springs are elastically deformed, and the locked portions 73 enter a state close to the surrounding wall portions 72, respectively, in the width direction perpendicular to the longitudinal direction of the groove member 7.

Furthermore, as the groove member 7 is inserted into the insertion through-hole 61, as illustrated in FIG. 3A, the locked convex portion 735 becomes positioned more above the upper end face 613 of the locking convex portion 612, and thus the plate-like portion 734 abuts the portion at which the locked portion insertion portion 611 constituted by the portion of the bottom plate 6 is formed. At the same time, the lower end face 736 of the locked convex portion 735 abuts the upper end face 613 of the locking portion convex portion 612, and the locked portion 73 is locked at the locking portion convex portion 612. With this locking, the groove member 7 is supported by the bottom plate 6 and fixed with respect to the bottom plate 6.

At the same time, the height adjustment convex portion 742 abuts the lower end face of the perpendicular extending portion 247 of the lower wall 24. At this moment, as illustrated in FIG. 3B, the positioning convex portion 716 of one end in the longitudinal direction of the groove-bottom-forming portion 715 and the positioning convex portion 716 of the other end in the longitudinal direction of the groove-bottom-forming position 715 are fit between the two rails 245, respectively, at the same time. With such a configuration, the groove member 7 is supported by the lower wall 24 and fixed with respect to the lower wall 24.

When removing the groove member 7 from the lower wall 24 and the bottom plate 6, the plate-like portion 734 is initially pressed so that the plate-like portion 734 of a pair of the locked portions 73 becomes close to the surrounding wall portion 72, a result of which the locked portion 73 is elastically deformed. With such a configuration, the plate-like portion 734 is spaced apart from the portion at which the locked portion insertion portion 611 constituted by the portion of the bottom plate 6 is formed. Then, when the lower end face 736 of the locked convex portion 735 is in the positional relationship not facing the upper end face 613 of the locking portion convex portion 612, the groove member 7 is withdrawn from the insertion through-hole 61. With such a configuration, the groove member 7 is removed from the bottom plate 6 and the lower wall 24.

In accordance with the substrate storing container 1 according to the first embodiment with the abovementioned configuration, it is possible to obtain the following effects.

The groove member 7 has a groove-forming portion 71 having a groove 701 opening downward formed therein, a surrounding wall portion 72, which is connected to the groove-forming portion 71, and is arranged around the groove-forming portion 71, and a locked portion 73, which is connected to the surrounding wall portion 72, is elastically deformable, and is locked by means of the locking portion of the bottom plate 6 (the portion which is a rim portion around the insertion through-hole 61 and forms the locked portion insertion portion 611) being elastically deformed.

For this reason, by configuring the groove-forming portion 71 and the surrounding wall portion 72 to be thick, it is possible to configure a strong groove member 7 by surrounding a strong groove-forming portion 71 with a strong surrounding wall portion 72. As a result, it is possible to configure the substrate storing container 1 having the groove member 7 which can withstand a load of the substrate storing container 1 of increased size. Furthermore, since it is possible to configure the groove member 7 so as to be strong, it is possible to suppress the deformation of the groove-forming portion 71 and the surrounding wall portion 72, and it is also possible to position and fix the groove member 7 with respect to the bottom plate 6 and the lower wall 24 with high precision.

Furthermore, the groove-forming portion 71 is connected to the one end (lower end 721) of the surrounding wall portion 72 in the axial direction with respect to a circumferential direction of the surrounding wall portion 72, and the groove 701 opens at the one end (lower end 721) of the surrounding wall portion 72 in the axial direction of the surrounding wall portion 72, and the locked portion 73 is connected to the other end (upper end 722) of the surrounding wall portion 72 in the axial direction of the surrounding wall portion 72. Therefore, it is possible to disperse the load on the groove member 7 to the one end and the other end (lower end 721 and upper end 722) of the surrounding wall portion 72 in the axial direction of the surrounding wall portion 72, and thus it is possible to improve the durability of the groove member 7.

Furthermore, the locked portion 73 is configured by a cantilever spring that extends toward the one end (lower end 721) of the surrounding wall portion 72 in the axial direction of the surrounding wall portion 72 along the outer face of the surrounding wall portion 72 from the other end (upper end 722) of the surrounding wall portion 72 in the axial direction of the surrounding wall portion 72. Therefore, it is possible to cause the cantilever spring to be elastically deformed against the biasing force of the cantilever spring so as to engage the locked portion 73 with the locking portion or so as to disengage the locked portion 73 with the locking portion. Therefore, it is possible to easily attach the locked portion 73 with the locking portion and remove the locked portion 73 with the locking portion.

Furthermore, the insertion through-hole 61 to which the groove member 7 can be inserted is formed in the bottom plate 6, the locking portion of the bottom plate 6 is configured by a portion of the bottom plate 6 which is a rim portion around the insertion through-hole 61, the cantilever spring includes the plate-like portion 734 located at the extending end of the cantilever spring and the locked convex portion 735 that is located more toward a base end side of the cantilever spring than the plate-like portion 734 and projects in a direction distancing from the surrounding wall portion 72, and the locked convex portion 735 is locked at the rim portion.

Therefore, by pressing the plate-like portion 734, it is possible to elastically deform the locked portion 73 easily, and thus it is possible to easily attach the locked portion 73 to the locking portion and remove the locked portion 73 from the locking portion. As a result, since it is not necessary to fix the groove member 7 to the lower wall 24 or the bottom plate 6 by means of press fitting, etc., it is possible to prevent from causing damage or abrasion as much as possible.

Furthermore, by the groove member 7 being inserted into the insertion through-hole 61 and stored in the space 244 formed between the bottom plate 6 and the lower wall 24, it can be configured so that the portion of the groove member 7 exposed outside the bottom plate 6 is set to be only the portion (groove-forming portion 71) that forms the V-shaped groove 701 mainly, a result of which it is possible to protect the majority of the groove member 7 by the bottom plate 6. As a result, it is possible to prevent, as much as possible, the groove member 7 from detaching from the bottom plate 6 and the lower wall 24 due to another member being brought into contact with the groove member 7.

Furthermore, at the upper end face 741 of the parallel wall portion 74 constituting the rib portion, the height adjustment convex portion 742 exists which projects upward from the upper end face of the parallel wall portion 74 and abuts the lower wall 24. For this reason, by setting the height adjustment convex portion 742 at an appropriate height, it is possible to fix the groove member 7 to the lower wall 24 and the bottom plate 6 without rattling.

Furthermore, the groove-bottom-forming portion 715 which is a portion of the groove-forming portion 71 and forms a bottom portion of the groove 701 has a linear form and, at both ends of the groove-bottom-forming portion 715, the positioning convex portion 716 exists which projects from both ends of the groove-bottom-forming portion 715. At the lower face 242 of the lower wall 24, the two rails 245 extending in parallel along the lower face 242 of the lower wall 24 are present projecting downward. Then, the positioning convex portion 716 can be fit between the two rails 245. With this fitting, it is possible to easily position the groove member 7 with respect to the lower wall 24.

Furthermore, the groove-forming portion 71 is connected over the entirety of one end of the surrounding wall portion 72 in the axial direction with respect to the circumferential direction of the surrounding wall portion 72, the groove 701 opens at one end (lower end 721) of the surrounding wall portion 72 in the axial direction of the surrounding wall portion 72 and the water-drain hole 702 which is in communication with the inner space of the surrounding wall portion 72 and the outer space of the surrounding wall portion 72 is formed at a connection portion of the groove-forming portion 71 and the surrounding wall portion 72 at one end (lower end 721) of the surrounding wall portion 72. For this reason, when washing the substrate storing container 1, it is possible to discharge a washing liquid, etc., which flows into a space surrounded by the upper face of the groove-forming portion 71 and the surrounding wall portion 72 into a space outside the space via the water-drain hole 702. As a result, it is possible to prevent a washing liquid, etc., from gathering in the space surrounded by the upper face of the groove-forming portion 71 and the surrounding wall portion 72.

Furthermore, the groove-member 7 has a point-symmetric shape with the center position as viewed from the bottom illustrated in FIG. 4C as a center. For this reason, when attaching the groove member 7 to the bottom plate 6 and the lower wall 24, the attachment can be facilitated regardless of the direction of the groove member 7.

The present invention is not limited to the abovementioned embodiments, and modifications thereto within the technical scope claimed in the claims are possible. For example, the shape and the configuration of the substrate storing container 1 are not limited to the shapes and the configurations of the abovementioned embodiments. More specifically, for example, although the lower end face 736 of the locked convex portion 735 abuts the upper end face of the locking portion convex portion 612 so that the locked portion 73 is locked at the locking portion, the present invention is not limited to this configuration. For example, it may be configured such that the locking portion convex portion 612 is not provided at a portion of the bottom plate 6 which is a rim portion around the insertion through-hole 61, and the locked convex portion 735 is locked at the rim portion.

EXPLANATION OF REFERENCE NUMERALS 1 substrate storing container
2 container main body
3 lid body
6 bottom plate
7 groove member
20 wall portion
21 container main body opening portion
22 back wall
23 upper wall
24 lower wall
25 first side wall
26 second side wall
27 substrate storing space
61 insertion through-hole
71 groove-forming portion
72 surrounding wall portion
73 locked portion
74 parallel wall portion (rib portion)
245 rail
701 groove
702 water-drain hole
715 groove-bottom-forming portion
716 positioning convex portion
724 inner face
734 plate-like portion
735 locked convex portion
742 height adjustment convex portion
W substrate

The invention claimed is:

1. A substrate storing container comprising:
a container main body including a tubular wall portion with a container main body opening portion formed at one end portion and an other end portion closed, the wall portion having a back wall, an upper wall, a lower wall, and a pair of side walls, the container main body opening portion being formed by one end portion of the upper wall, one end portion of the lower wall, and one end portions of the side walls, wherein a substrate storing space that can store a plurality of substrates and is in communication with the container main body opening portion is formed by an inner face of the upper wall, an inner face of the lower wall, inner faces of the side walls, and an inner face of the back wall;
a lid body that is removably attached to the container main body opening portion and can close the container main body opening portion;
a bottom plate having a plate-like shape, arranged to face an outer face of the lower wall, and including a locking portion; and
a groove member including a groove-forming portion having a groove opening downward formed therein, a surrounding wall portion, which is connected to the groove-forming portion, and is arranged around the groove-forming portion, and a locked portion, which is connected to the surrounding wall portion, is elastically deformable, and is locked by the locking portion of the bottom plate by being elastically deformed, the groove member being supported and fixed by the lower wall and the bottom plate,
wherein the groove member includes a groove-bottom-forming portion, which is a portion of the groove-forming portion and which forms a bottom portion of the groove, and
wherein an upper end face of the surrounding wall portion projects upward more above than an upper end face of the groove-bottom forming portion.

2. The substrate storing container according to claim 1, wherein the groove-forming portion is connected to one end of the surrounding wall portion in an axial direction with respect to a circumferential direction of the surrounding wall portion, and the groove opens at an end of the surrounding wall portion in the axial direction of the surrounding wall portion, and
wherein the locked portion is connected to another end of the surrounding wall portion in the axial direction of the surrounding wall portion.

3. The substrate storing container according to claim 2, wherein the locked portion is configured by a cantilever spring that extends toward one end of the surrounding wall portion in the axial direction of the surrounding wall portion, along an outer face of the surrounding wall portion, from another end of the surrounding wall portion in the axial direction of the surrounding wall portion.

4. The substrate storing container according to claim 3, wherein an insertion through-hole to which the groove member can be inserted is formed in the bottom plate, and the locking portion of the bottom plate is configured by a portion of the bottom plate which is a rim portion around the insertion through-hole,
wherein the cantilever spring includes a plate-like portion located at an extending end of the cantilever spring, and a locked convex portion that is located more toward a base end side of the cantilever spring than the plate-like portion and projects more in a distancing direction from the surrounding wall portion than the plate-like portion, and
wherein the locked convex portion is locked at the rim portion.

5. The substrate storing container according to claim 1, wherein the groove member includes a rib portion which is connected to one portion of an inner face of the surrounding wall portion, another portion of the inner face of the surrounding wall portion, and the groove-forming portion, an upper end face of the rib portion constituting an upper end face of the groove member, and wherein a height adjustment convex portion projecting upward from an upper end face of the rib portion and abutting the lower wall is disposed at an upper end face of the rib portion.

6. The substrate storing container according to claim 1, wherein the groove-bottom-forming portion which is a portion of the groove-forming portion and forms a bottom portion of the groove has a linear form, and a positioning convex portion projecting from both ends of the groove-bottom-forming portion is disposed at both ends of the groove-bottom-forming portion, wherein, at a lower face of the lower wall, two rails extending in parallel along a lower face of the lower wall are disposed at the lower face of the lower wall to project downward, and wherein the positioning convex portion can be fit between the two rails.

7. The substrate storing container according to claim 1, wherein the groove-forming portion is connected over an entirety of one end of the surrounding wall portion in an axial direction with respect to a circumferential direction of the surrounding wall portion, and the groove opens at one end of the surrounding wall portion in the axial direction of the surrounding wall portion, and wherein a water-drain hole which is in communication with an inner space of the surrounding wall portion and an outer space of the surrounding wall portion is formed at a connection portion of the groove-forming portion and the surrounding wall portion at one end of the surrounding wall portion.

* * * * *